United States Patent
Gupta et al.

(10) Patent No.: US 11,854,660 B2
(45) Date of Patent: Dec. 26, 2023

(54) SLEW SIGNAL SHAPER CIRCUIT USING TWO SIGNAL PATHS

(71) Applicant: NVIDIA Corp., Santa Clara, CA (US)

(72) Inventors: Lalit Gupta, Fremont, CA (US);
Andreas Jon Gotterba, Santa Clara, CA (US); Jesse Wang, Santa Clara, CA (US)

(73) Assignee: NVIDIA CORP., Santa Clara, CA (US)

( * ) Notice: Subject to any disclaimer, the term of this patent is extended or adjusted under 35 U.S.C. 154(b) by 149 days.

(21) Appl. No.: 17/556,046

(22) Filed: Dec. 20, 2021

(65) Prior Publication Data

US 2023/0197127 A1 Jun. 22, 2023

(51) Int. Cl.
*G11C 7/12* (2006.01)
*G11C 5/06* (2006.01)
*G11C 7/22* (2006.01)

(52) U.S. Cl.
CPC .............. *G11C 7/12* (2013.01); *G11C 5/063* (2013.01); *G11C 7/22* (2013.01)

(58) Field of Classification Search
CPC .............. G11C 7/12; G11C 5/063; G11C 7/22
See application file for complete search history.

(56) References Cited

U.S. PATENT DOCUMENTS

| | | | |
|---|---|---|---|
| 5,345,422 A * | 9/1994 | Redwine | G11C 5/143 327/143 |
| 5,802,004 A * | 9/1998 | McClure | G11C 7/065 365/205 |
| 6,294,924 B1 | 9/2001 | Ang et al. | |
| 6,297,677 B1 | 10/2001 | Ang et al. | |
| 6,897,492 B2 | 5/2005 | Ochi | |
| 7,248,088 B2 | 7/2007 | Hargan | |
| 8,174,299 B2 | 5/2012 | Hargan | |
| 8,672,081 B2 | 3/2014 | Kume et al. | |
| 10,192,938 B2 | 1/2019 | Yu et al. | |
| 10,305,487 B1 | 5/2019 | Mattia | |
| 10,636,847 B2 | 4/2020 | Yu et al. | |
| 2013/0051128 A1* | 2/2013 | Lu | G11C 11/413 327/263 |
| 2018/0096715 A1* | 4/2018 | Nautiyal | G11C 7/12 |
| 2020/0219945 A1 | 7/2020 | Yu et al. | |
| 2020/0379032 A1* | 12/2020 | Höppner | H03K 3/0315 |
| 2022/0351783 A1* | 11/2022 | Xie | G11C 16/32 |

* cited by examiner

*Primary Examiner* — Donald H B Braswell
(74) *Attorney, Agent, or Firm* — Rowan TELS LLC

(57) ABSTRACT

To mitigate pulse shape degradation along a signal route, the signal is driven from two ends. One end of the route is loaded and the other is relatively unloaded. The loaded route and unloaded route may traverse two different metal layers on a printed circuit board. The two routes may thus be related such that the unloaded route has less RC distortion effects on the signal than does the loaded route.

13 Claims, 8 Drawing Sheets

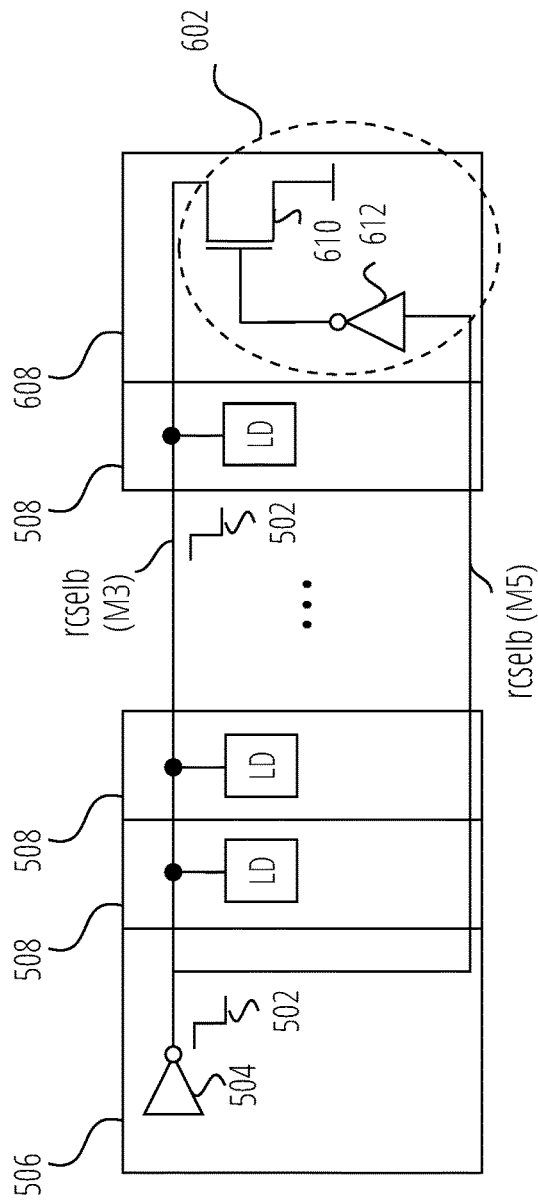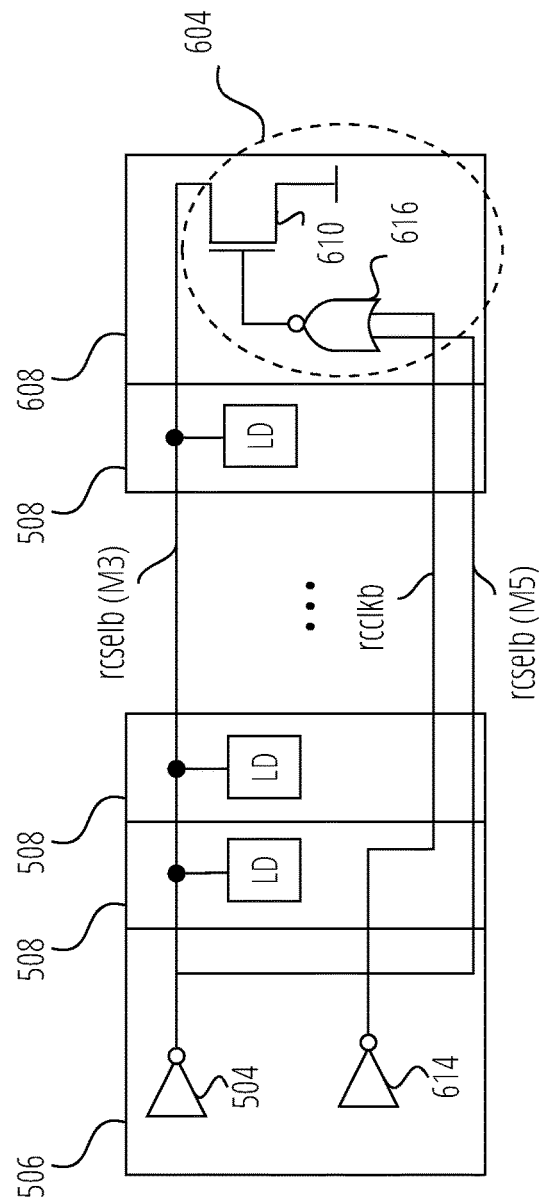
FIG. 6A
FIG. 6B

SLEW SIGNAL SHAPER CIRCUIT USING TWO SIGNAL PATHS

BACKGROUND

In advanced circuit fabrication processes, metal resistance may become a limiting factor of performance. For example in dense machine memories, at temperatures above a threshold, increases in metal resistance (reduced conductance) lead to pulse width degradation in critical signals such as read column select, bit line pre-charge, write column select, and sense amplifier enable. Conventional techniques to address pulse width degradation typically involve undesirable increases in circuit area or delay, such as inserting one or more signal buffers along the propagation path of the signal.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 6A depicts a pulse shaper 602 for a signal in accordance with one embodiment.

FIG. 6B depicts a pulse shaper 604 for a signal in accordance with another embodiment.

DETAILED DESCRIPTION

Figure 1:
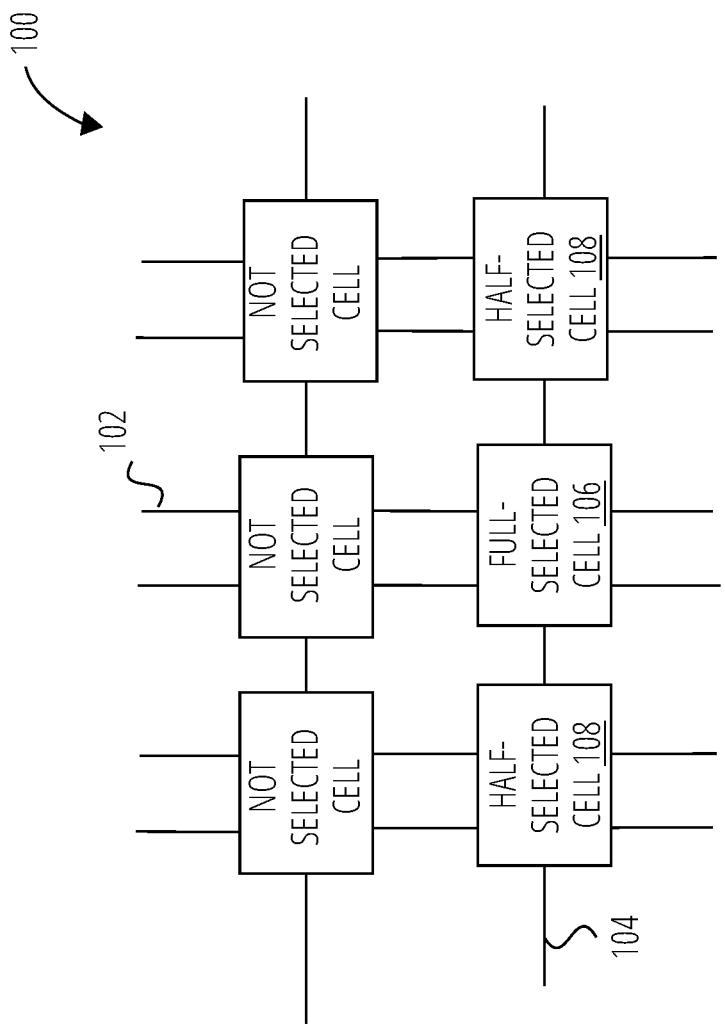
FIG. 1 depicts memory cells 100 in accordance with one embodiment.

The following description of preferred embodiments is presented in terms of memory cells and memory devices. However, the disclosed mechanisms are more generally applicable to pulse shaping for any signal that experiences shape/slew degradation (e.g., due to parasitic capacitances and resistances) as it traverses a loaded route on a circuit die or board. The following description may reference the following terms. Other terms should be accorded their ordinary meaning in the art unless otherwise indicated by context.

"Bit-storing cell" is another term for a memory cell, but also encompasses value-storing circuits such as latches and registers.

"Global bit line" refers to a bit line that spans groups of memory cells each with local bit lines.

"Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Memory cell" refers to any circuit that stores a binary value.

"Memory controller" refers to logic that generates control signals for reading, writing, and managing memory cells.

"Output transistor" refers to a transistor that interfaces a memory cell to a global bit line. In particular the output transistor may be operated to pull up or down on the voltage level on the global bit line.

"Stored value" is a short reference for stored bit value.

In the memory system examples herein, a read column select signal is a signal used to select a memory array column (e.g., a stack of bit-storing cells arranged in series), and this signal is referred to as "rcsel" and its complement as "rcselb". The signal to read (sense) from a bit line in the memory array is referred to as "rbl". Generally herein, the complement of a signal is denoted with a postfix of "b".

To mitigate pulse shape degradation, the signal route may be driven from two ends, in a loop. In one specific embodiment, the loop traverses through two different metal routing layers on a multi-layer printed circuit board. The two ends of the route may be referred to as the loaded route and the unloaded route, respectively. In the specific examples herein, the two metal routing layers may be referred to as M3 (the loaded route) and M5 (the unloaded route). The two routes may thus be related such that the unloaded route (e.g., M5) has less RC distortion effects on the signal than does the loaded route (e.g., M3). The loads on the signal may couple only to the loaded route in the loaded layer, thus enabling the unloaded route to have lower impedance, especially capacitance, than the loaded route.

In one aspect, a circuit includes a signal driver to generate a signal at a first end of a signal path, the signal path splitting into a first route and a second route, where the first route is loaded to an extent that, in the absence of the second route, degrades a slew rate of the signal at a second end of the signal path. The second route is lightly loaded (e.g., ≤40% of the RC load, or even ≤10% of the RC load) or unloaded (e.g., ≤3% of the RC load) relative to the first route. A pulse shaping circuit couples the first route to the second route at the second end of the signal path.

In some embodiments, the first route traverses a first metal routing layer in a printed circuit board and the second route traverses a second metal routing layer in the printed circuit board different than the first metal routing layer.

In some embodiments, the signal is a read column select signal in a machine memory system.

In some embodiments, the first route is loaded with a plurality of machine memory devices.

In some embodiments, the second route is configured without any loading (other than intrinsic loading in the metal conductor) between the signal driver and the pulse shaping circuit.

The following description of exemplary embodiments is presented in terms of signal routes loaded with multiple memory devices in a machine memory system. As noted previously, the disclosed mechanisms are more generally applicable to pulse shaping for any signal that experiences shape/slew degradation as it traverses a loaded route on a circuit die or board.

FIG. 1 depicts memory cells 100 in a machine memory circuit in one embodiment. The memory cells 100 may utilize a six- or eight-transistor technology, for example. Vertical lines represent bit lines 102 and horizontal lines represent word lines 104. In this example the word line WL(n-1) is selected, meaning activated to perform a memory operation on one of the cells along the word line. The bit lines for full-selected cell 106 are also activated, and in conjunction with assertion of the word line WL(n-1) fully selects the full-selected cell 106 for a memory operation. The bit lines for the half-selected cells 108 are not activated, hence the cells are "half-selected".

Figure 2:
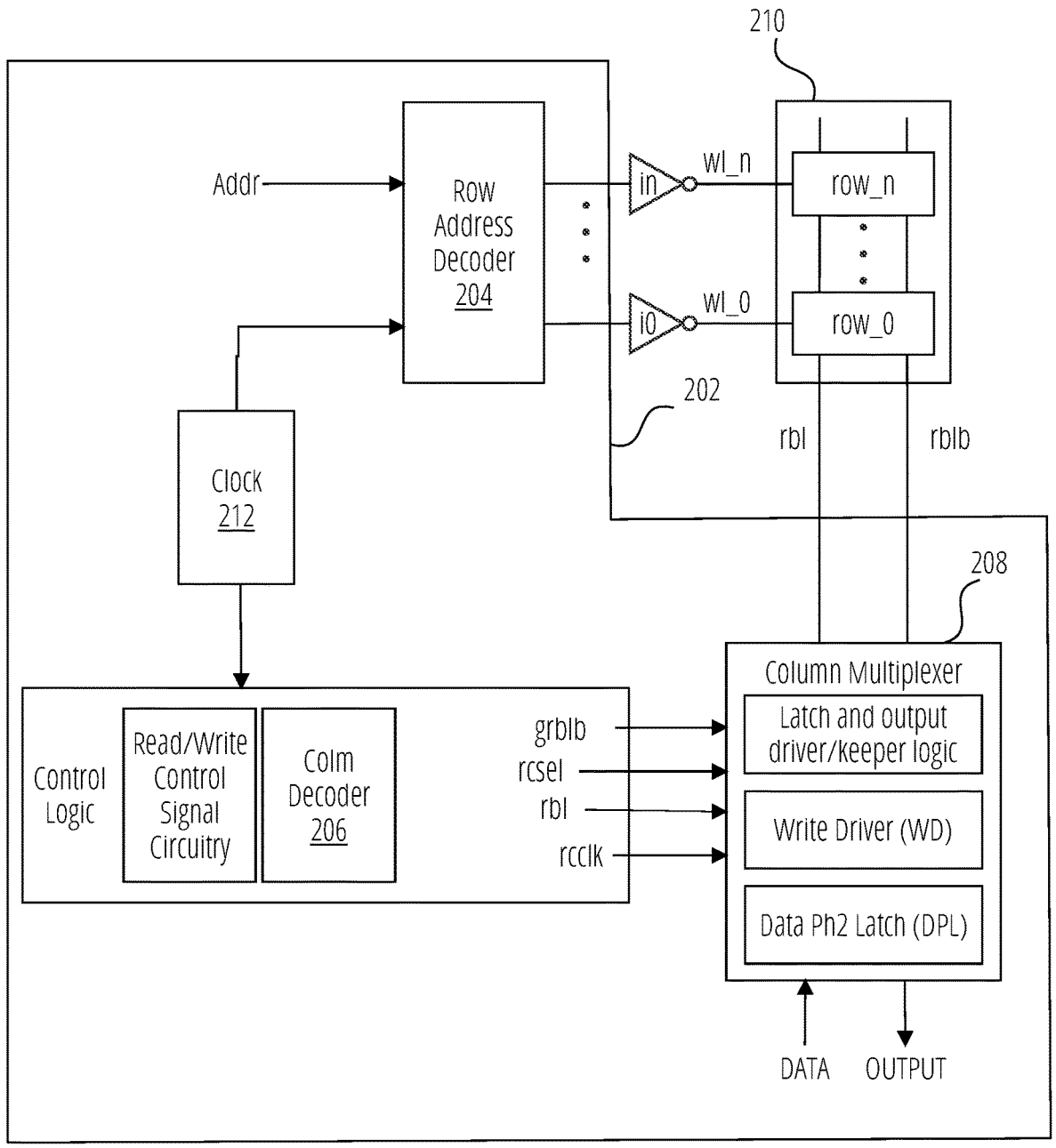
FIG. 2 depicts a memory controller in accordance with one embodiment.

FIG. 2 depicts a memory controller 202 in one embodiment. A row address decoder 204 translates a memory address into a row (word line) selection, and a column decoder 206 translates the address into column (bit line) selection(s) (rcsel signal). The bit-storing cells along the selected row and column are read by the column multiplexer 208, which includes latches for data read from the machine memory 210, and logic for writing values into the bit-storing cells of the machine memory 210. These operations may be performed synchronously and thus coordinated by a clock 212.

Figure 3:
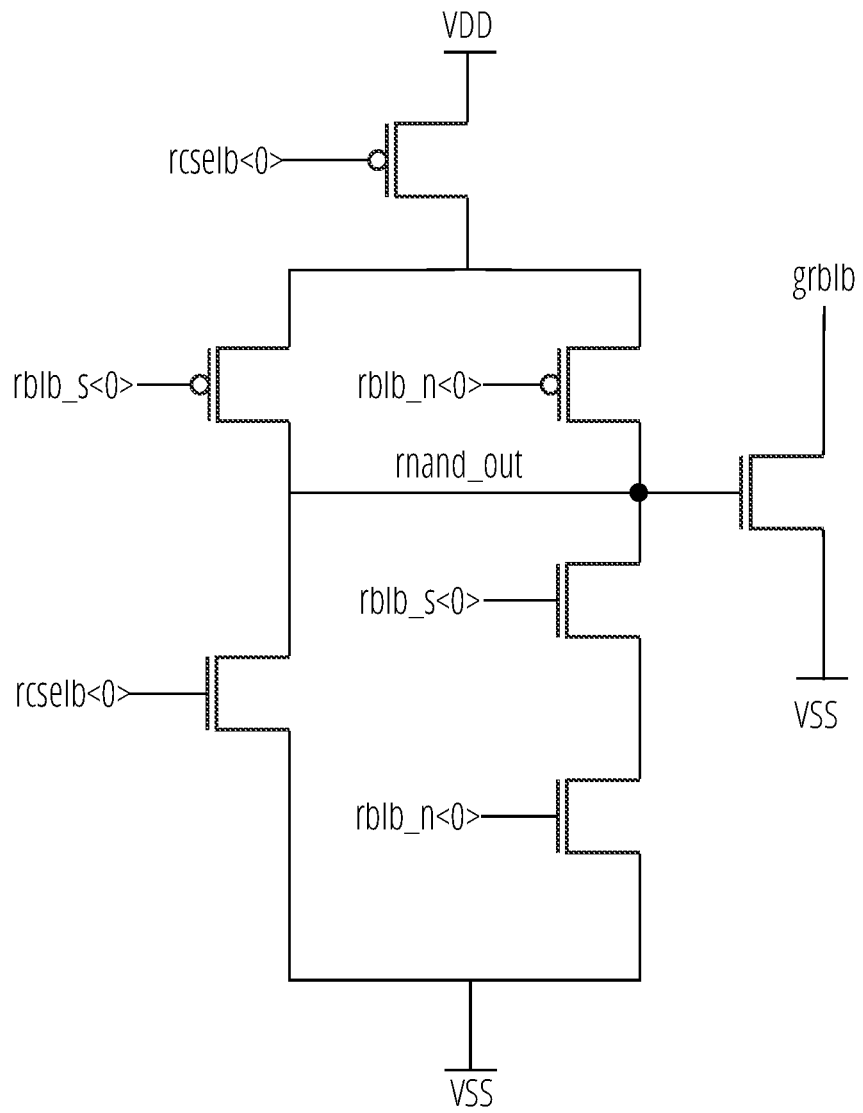
FIG. 3 depicts bias circuitry according to one embodiment.

FIG. 3 depicts exemplary circuitry for reading a stored bit and includes references to signals that will be utilized in the description of exemplary embodiments below. During a read evaluation 0 operation on a memory cell, signal rblb_s is turned "on" and rblb_n is turned "off". Signal rnand_out is "on" and pulls grblb toward ground plane voltage VSS. Either rblb_n will discharge or rblb_s will discharge, or when rblb_n is discharging through the bitcell, rblb_s will remain precharged to VDD.

During a read evaluation 1 operation on a memory cell, rblb_s is at VDD, rblb_n is at VDD, and grblb stays, ideally, at VDD because no discharge occurs through any local output transistor of the bit-storing cells on the global bit line. Neither rblb_s nor rblb_n discharge, both are floating at VDD and hence rnand_out remains at VSS and grblb remains floating.

Figure 4:
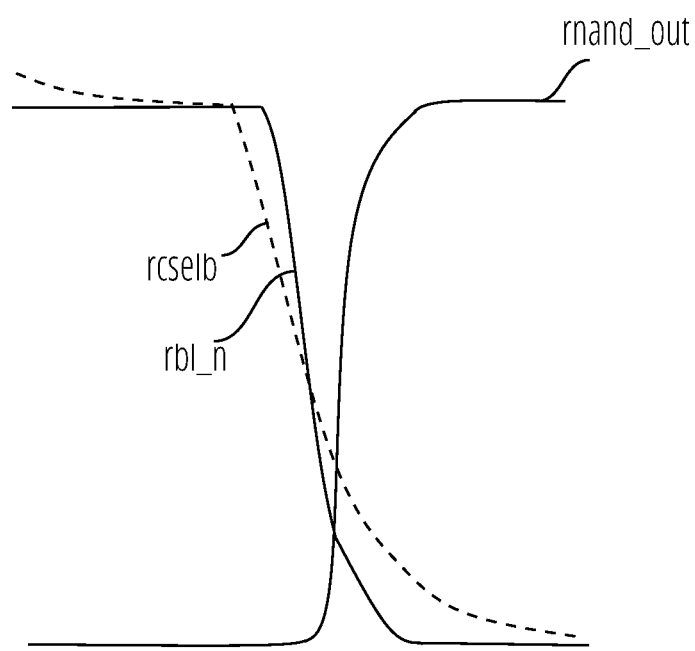
FIG. 4 depicts an example characteristic of read bit line and read column select signals in a machine memory device.

FIG. 4 depicts an example characteristic of read bit line and read column select signals in a machine memory device. In dual-port memory devices utilized single-ended memory read circuitry, the rcsel signal (which is heavily loaded) should substantially discharge before the rbl signal discharges through the bit cell being read. FIG. 4 depicts how this may not in fact occur in conventional single-ended read circuitry. In the depicted example, due to slew rate distortion of the rcsel signal especially for memory devices near the end of its route, rbl discharges before rcsel does.

Figure 5:
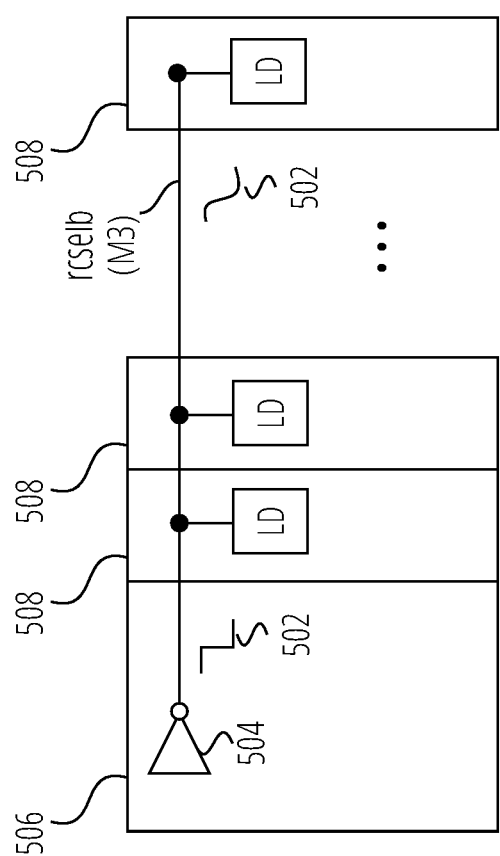
FIG. 5 depicts an example of global signal slew degradation.

FIG. 5 depicts an example of global signal slew degradation. A signal 502 (rcselb) originates from a driver circuit 504 of a column driver 506 in a machine memory system that utilizes single-ended read circuitry. The route of the signal 502 is loaded with a number of memory devices 508. Near the end of the route, the slew of the signal 502 becomes degraded.

FIG. 6A depicts a pulse shaper 602 for a signal in accordance with one embodiment. The route for the signal 502 is now driven from two sides: a loaded route (M3) and an unloaded route (M5). The M3 and M5 routes may in some embodiments traverse different metal layers on a printed circuit board. An edge cell 608 comprising a pulse shaper 602 is provided at an end of the route of the signal 502 distal from the driver circuit 504. The signal 502 traverses both routes and on the unloaded route drives the NMOS transistor 610 via the inverter 612. The NMOS transistor 610 turns on, pulling down on the signal 502 from the distal end of the signal route. This results in an improved slew and less degradation of the signal 502 especially for loads near the distal end of the route of the signal 502.

One issue with the embodiment in FIG. 6A is that a rising edge propagating on M3 may come into contention, for some window of time, with the pulse shaper 602 operating as a current sink. Although the slew of falling edge signals may be enhanced, this may actually increase slew degradation for rising edge signals on M3. This issue may be mitigated by the embodiment in FIG. 6B. In the embodiment of FIG. 6B, to prevent improper timing or contention, a falling edge on M5 will not pull down on M3 unless a second, coordinating signal is present. In this example the second signal is called "rcclkb" and it originates from a second driver 614. In the pulse shaper 604 of FIG. 6B, the NOR gate 616 does not turn on the NMOS transistor 610 unless both rcselb and rcclkb are low. With proper timing of rcclkb, the degradation of slew on falling edge signals on M3 is mitigated, and contention between driver circuit 504 and the pulse shaper 604 for rising edge signals on M3may be mitigated or avoided altogether.

Figure 6C:
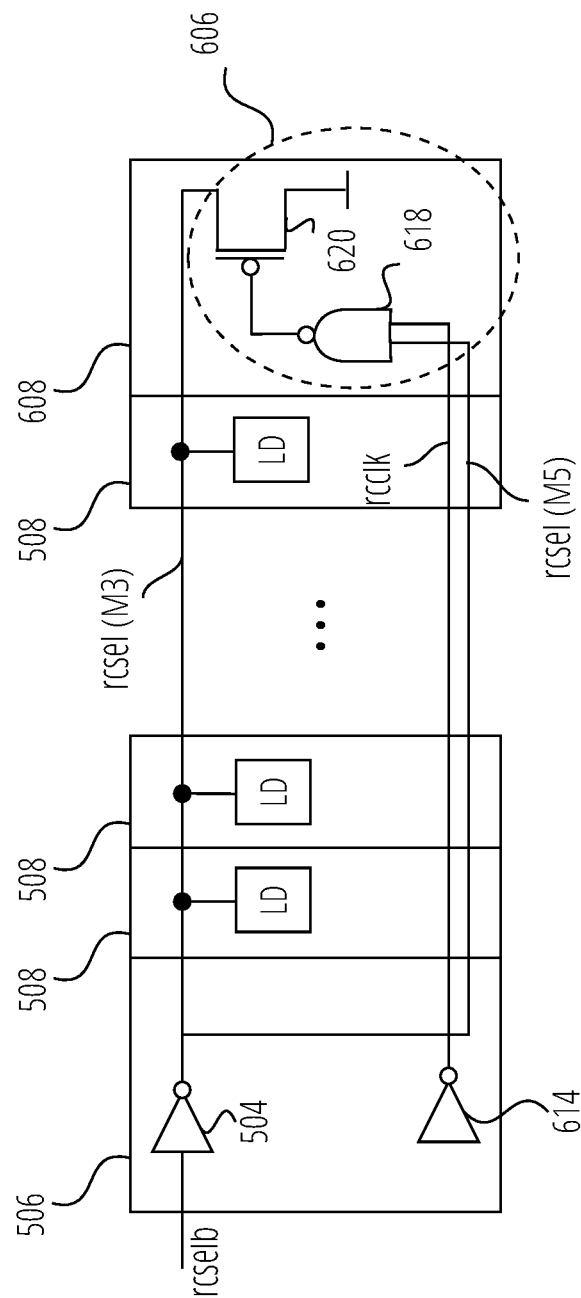
FIG. 6C depicts a pulse shaper 606 for a signal in accordance with another embodiment.

FIG. 6C depicts a pulse shaper 606 for a signal in accordance with another embodiment. The embodiment depicted in FIG. 6C mitigates slew distortion on rising edges of signals on M3. To prevent improper timing or contention, a rising edge on M5 will not disable the pull down of M3 unless the second, coordinating signal is present. In the pulse shaper 606 of FIG. 6C, the NAND gate 618 does not turn off the NMOS transistor 610 unless both rcsel and rcclk are high. With proper timing of rcclk (e.g., propagating two load stages earlier than rcsel), the degradation of slew on rising edge signals on M3 is mitigated, and contention between driver circuit 504 and the pulse shaper 604 for falling edge signals on M3 may be mitigated or avoided altogether.

The pulse shaping circuit thus generally includes a coupling of the second route to a gate of a transistor configured to pull down the signal on the first route. In some embodiments, the gate of the transistor is driven by logic to combine the signal on the second route and a timing signal. In some embodiments, the gate of the transistor may be driven by NAND logic (i.e., any combination of circuits performing a NAND transformation of inputs to outputs). In some embodiments, the gate of the transistor is driven by NOR logic (i.e., any combination of circuits performing a NOR transformation of inputs to outputs).

Figure 7:
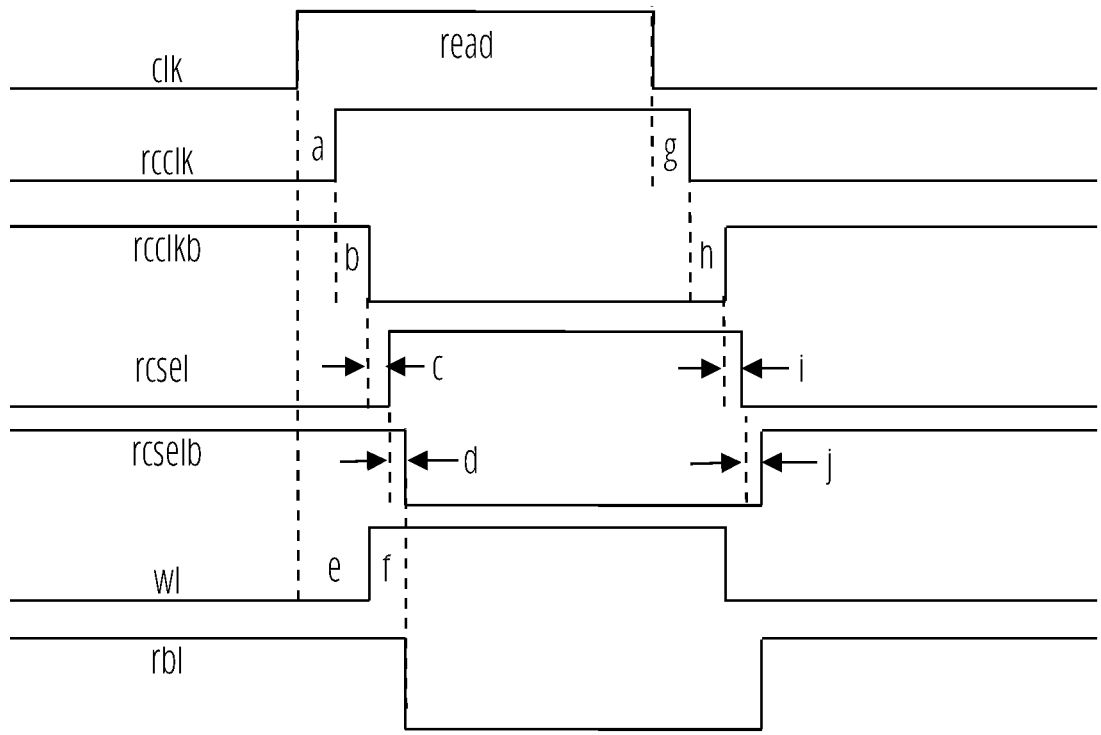
FIG. 7 depicts a signal timing diagram in accordance with one embodiment.
Figure 8:
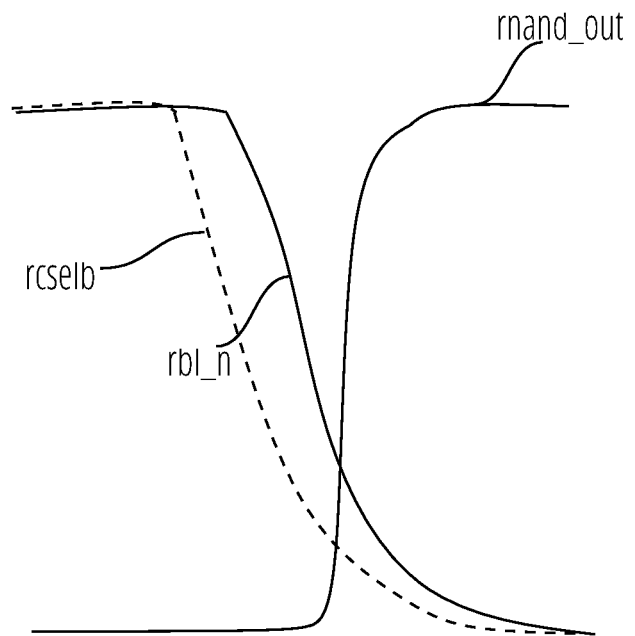
FIG. 8 depicts an example of an improved characteristic of read bit line and read column select signals in a machine memory device.

FIG. 7 depicts a signal timing diagram in accordance with one embodiment. Time intervals between edges of some signals are labeled with lower case letters. A memory controller may be configured to generate these signals such that that a+b+c+d<e+f so that access time for a memory cell is not limited by a+b+c+d. Example signal characteristics for rcselb and rbl when utilizing mechanisms in accordance with the disclosed embodiments are depicted in FIG. 8.

Listing of Drawing Elements 100 memory cells
102 bit line
104 word line
106 full-selected cell
108 half-selected cell
202 memory controller
204 row address decoder
206 column decoder 208 column multiplexer
210 machine memory
212 clock
502 signal
504 driver circuit
506 column driver
508 memory device
602 pulse shaper
604 pulse shaper
606 pulse shaper
608 edge cell
610 NMOS transistor
612 inverter
614 driver
616 NOR gate
618 NAND gate
620 PMOS transistor Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.0 § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit comprising:
a signal driver to generate a signal at a first end of a signal path;
the signal path splitting into a first route and a second route, wherein the first route is loaded to an extent that, in the absence of the second route, degrades a slew rate of the signal at a second end of the signal path;
the second route being lightly loaded or unloaded relative to the first route;
a transistor configured to pull down the signal on the first route;
a pulse shaping circuit coupling the first route to the second route at the second end of the signal path; and
wherein the pulse shaping circuit comprising a NAND combination of the second route and a timing control signal coupled to a gate of the transistor.

2. The circuit of claim 1, wherein the first route traverses a first metal routing layer in a printed circuit board and the second route traverses a second metal routing layer in the printed circuit board different than the first metal routing layer.

3. The circuit of claim 1, wherein the signal is a read column select signal in a machine memory system.

4. The circuit of claim 1, wherein the first route is loaded with a plurality of machine memory devices.

5. The circuit of claim 1, wherein the second route is configured without any loading between the signal driver and the pulse shaping circuit.

6. A memory system comprising:
a plurality of memory devices configured as loads along a first route of a signal path;
the signal path comprising a second route that is unloaded;
a signal driver to generate a signal at a first end of the signal path;
a pulse shaping circuit coupling the first route to the second route at a second end of the signal path; and
wherein the pulse shaping circuit comprising one of a NAND or NOR combination of the second route and a timing control signal coupled to a gate of a pull-down transistor configured on the first route.

7. The memory system of claim 6, wherein the first route traverses a first metal routing layer in a printed circuit board and the second route traverses a second metal routing layer in the printed circuit board different than the first metal routing layer.

8. The memory system of claim 6, wherein the signal is a read column select signal to the plurality of memory devices.

9. The memory system of claim 6, wherein the pulse shaping comprises:
a transistor circuit comprising a source, a drain, and a gate; and
the first route is coupled to the source and the second route is coupled to the gate.

10. A circuit comprising:
a signal driver to generate a signal at a first end of a signal path;
the signal path splitting into a first route and a second route, wherein the first route is loaded to an extent that, in the absence of the second route, degrades a slew rate of the signal at a second end of the signal path;
the second route being lightly loaded or unloaded relative to the first route;
a transistor configured to pull down the signal on the first route;
a pulse shaping circuit coupling the first route to the second route at the second end of the signal path; and
wherein the pulse shaping circuit comprising a NOR combination of the second route and a timing control signal coupled to a gate of the transistor.

11. The circuit of claim 10, wherein the first route traverses a first metal routing layer in a printed circuit board and the second route traverses a second metal routing layer in the printed circuit board different than the first metal routing layer.

12. The circuit of claim 10, wherein the first route is loaded with a plurality of machine memory devices.

13. The circuit of claim 10, wherein the second route is configured without any loading between the signal driver and the pulse shaping circuit.

* * * * *